US005283477A

United States Patent [19]

Shibata

[11] Patent Number: 5,283,477

[45] Date of Patent: Feb. 1, 1994

[54] COMMON DRIVER CIRCUIT

[75] Inventor: Takeshi Shibata, Tochigi, Japan

[73] Assignee: Sharp Kabushiki Kaisha, Osaka, Japan

[21] Appl. No.: 851,257

[22] Filed: Mar. 13, 1992

Related U.S. Application Data

[63] Continuation of Ser. No. 574,468, Aug. 28, 1990, abandoned.

[30] Foreign Application Priority Data

Aug. 31, 1989 [JP] Japan .......................... 1-102406[U]
Aug. 14, 1990 [JP] Japan .......................... 2-215496

[51] Int. Cl.[5] .......................... H03L 1/00; H03K 3/01

[52] U.S. Cl. .......................... 307/264; 307/296.1; 307/296.6; 330/290

[58] Field of Search .......................... 307/264, 268, 296.1, 307/296.6, 491, 493, 270; 350/332, 333; 330/129, 285, 290

[56] References Cited

U.S. PATENT DOCUMENTS 2,929,998 3/1960 Diehl .......................... 330/129
3,678,406 7/1972 Avins .......................... 330/285
4,492,926 1/1985 Kusakabe et al. .......................... 307/264
4,551,642 11/1985 Aizawa et al. .......................... 307/264
4,843,345 6/1989 Söderström .......................... 330/129

FOREIGN PATENT DOCUMENTS 0199361 10/1986 European Pat. Off. .
0241562 10/1987 European Pat. Off. .

*Primary Examiner*—John Zazworsky
*Attorney, Agent, or Firm*—David G. Conlin; Robert F. O'Connell

[57] ABSTRACT

A common driver circuit for driving a load heavy in a capacitive property such as a common electrode or the like of a liquid crystal panel is composed of the simple circuit construction provided with each circuit of the voltage follower, the low-pass filter, the feedback, the control so that the variation in the direction current component which gives bad influences in the processing of the signals of this type of circuit is restrained to improve the reliability, and the direct current is not required to be cut to eliminate the direct current cutting capacitor of the large capacity.

4 Claims, 6 Drawing Sheets

COMMON DRIVER CIRCUIT

This is a continuation of copending application Ser. No. 07/574,468 filed on Aug. 28, 1990 now abandoned.

BACKGROUND OF THE INVENTION

The present invention generally relates to a common driver circuit for driving a large capacitance load such as a common electrode, or the like, of a liquid crystal panel.

Generally, as shown in FIG. 6, a common driver circuit built into a conventional liquid crystal display apparatus has a bias supplied through a variable resistor 2 to a buffer amplifier 1 to which a common amplitude signal (i.e., a frame pulse FP) is inputted, the amplitude of the common amplitude signal being adjusted by the adjustment of a bias. The output of the buffer amplifier 1 is such that the direct current component therein is removed by a capacitor C1 for such purpose and a common bias at the output is adapted to be supplied by a variable resistor 3. The above described common amplitude signal (FP) and the common bias via the variable resistor 3 are supplied to a common electrode of a liquid crystal panel.

In a conventional embodiment, in order to obtain an output amplitude signal to which a common bias is added, the direct current component had to be removed by the capacitor C1 at the output of the buffer amplifier 1. Therefore, in order to provide the common bias for each field of the liquid crystal display panel, a capacitor of large capacity was required as a capacitor C1. Also, as the common bias depends upon the power voltages Vcc, −Vee, to be applied to the variable resistor 3, the common bias can change and produce adverse effects upon the liquid crystal panel when these power voltages change.

As shown in FIG. 6, conventionally the direct current component in the common output was removed by the capacitor C1 after amplifying the frame pulse, and the common bias was added by a variable resistance. The amplitude of the common output was sometimes changed as much as 8 volts at its maximum. Also, the voltage −Vee connected with the common bias adjustment resistance 3 sometimes cannot be adjusted in relation to the source power voltage of the panel, depending upon the common bias which is to be applied. Therefore, the voltage −Vee was required to be a relatively low voltage (e.g., −21 V). Since the voltage −Vee varies independently of the variation in the source power voltage Vcc of the panel, a direct current component may be added to the panel when the source power voltage is not stable. When the voltage for providing the common bias is taken from the same power line as the source power of voltage Vcc of the panel, the bias to be set by resistance 3 varies in the same direction as the variation in the source power voltage, with a disadvantage that it is difficult to apply the direct current component to the panel. Also, in the specification for the panel, both variations in the central voltage of the video signal to be applied to the source driver and variations in the central voltage at the common bias are required to be controlled in accordance with the conditions of the signal content, the power voltage variations, and so on. In the video signal, feedback is already applied and such signal is stable, while in the common bias, the specification requirement was not necessarily observed because of the above described causes.

SUMMARY OF THE INVENTION

Accordingly, the present invention has been developed with a view to substantially eliminating the above described drawbacks and has for its object to provide a common driver circuit, which is capable of supplying a common output, provided with a stable bias, with no variations occurring in the common bias, in a manner such that a capacitor of large capacity for removal of a direct current component is not required.

In order to achieve the above described object, the present invention comprises a common driver circuit for driving a liquid crystal panel which includes an output circuit comprising a buffer amplifier capable of sufficiently driving a capacitive load or a voltage follower, means for supplying a common signal and a common bias at the output of the above described output circuit, a bias setting means for setting the above described common bias, a control means which detects the direct current level of the above described output circuit, so that the common bias set by the above described bias setting means may be normally maintained in response to the detected direct current level.

According to such construction, the common bias for the bias setting means is supplied to the output circuit and, if the common bias varies, the variation is compensated by the control means, so that the common bias is normally maintained.

BRIEF DESCRIPTION OF THE DRAWINGS

These and other objects and features of the present invention will become apparent from the following description taken in conjunction with the preferred embodiment thereof with reference to the accompanying drawings, in which.

DETAILED DESCRIPTION OF THE INVENTION

Figure 1:
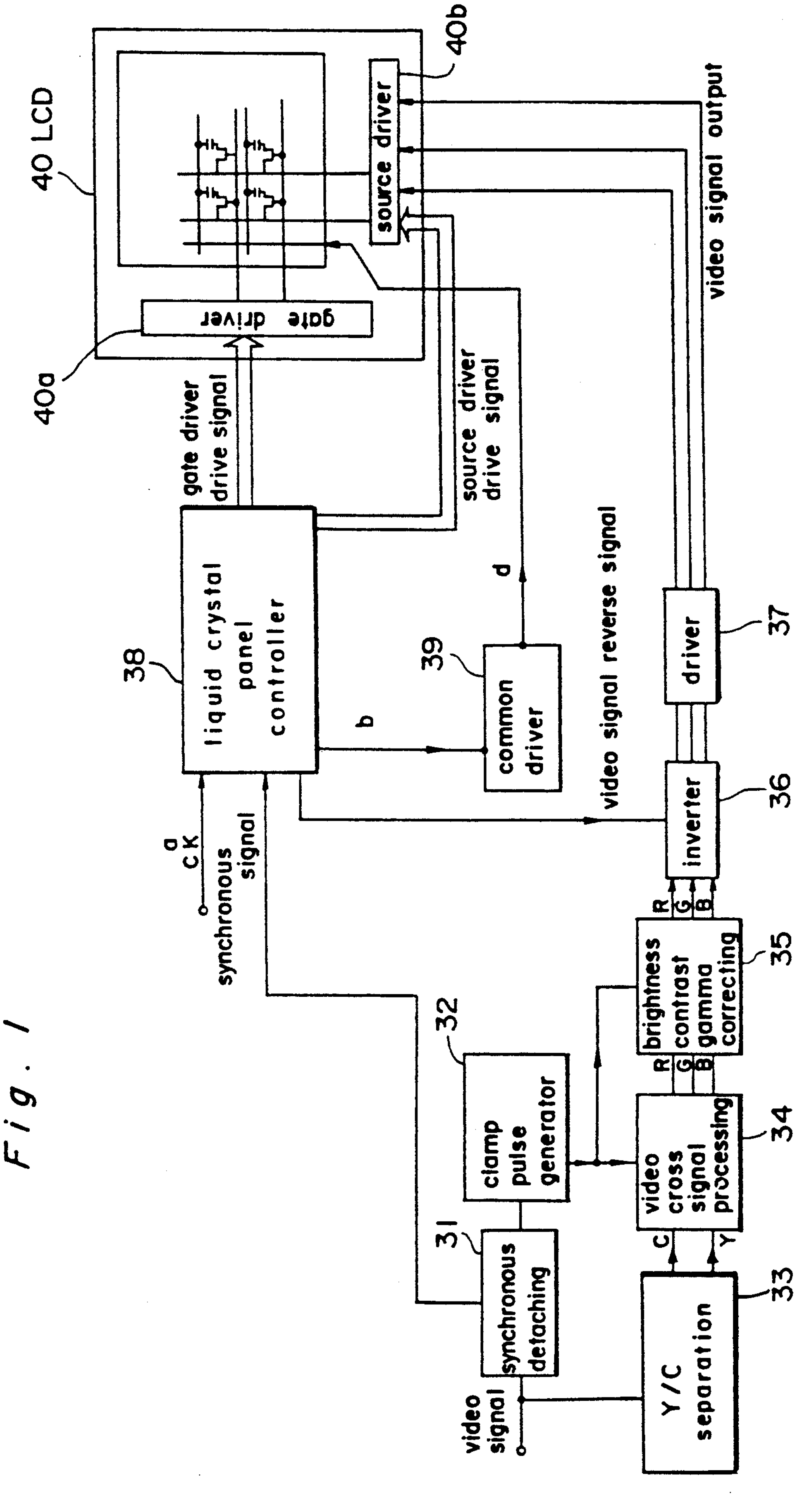
FIG. 1 is a block diagram showing the whole construction of a liquid crystal display apparatus into which a common driver circuit of the present invention has been built.

Before the description of the present invention is presented, it should be noted that like parts are designated by like reference numerals throughout the accompanying drawings.

Figure 2:
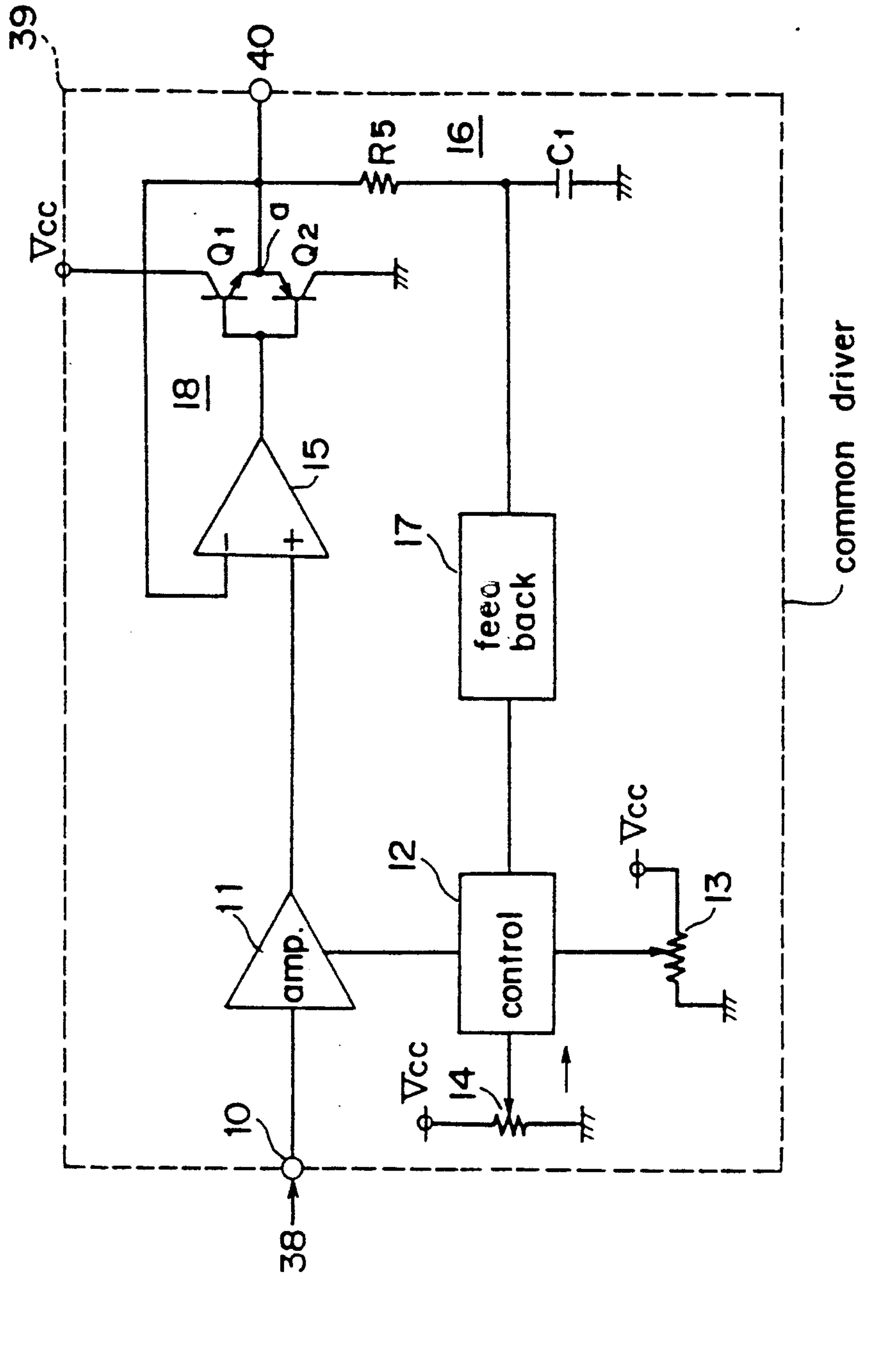
FIG. 2 is a block diagram showing the schematic construction in one embodiment of a common driver circuit in accordance with the present invention.
Figure 3:
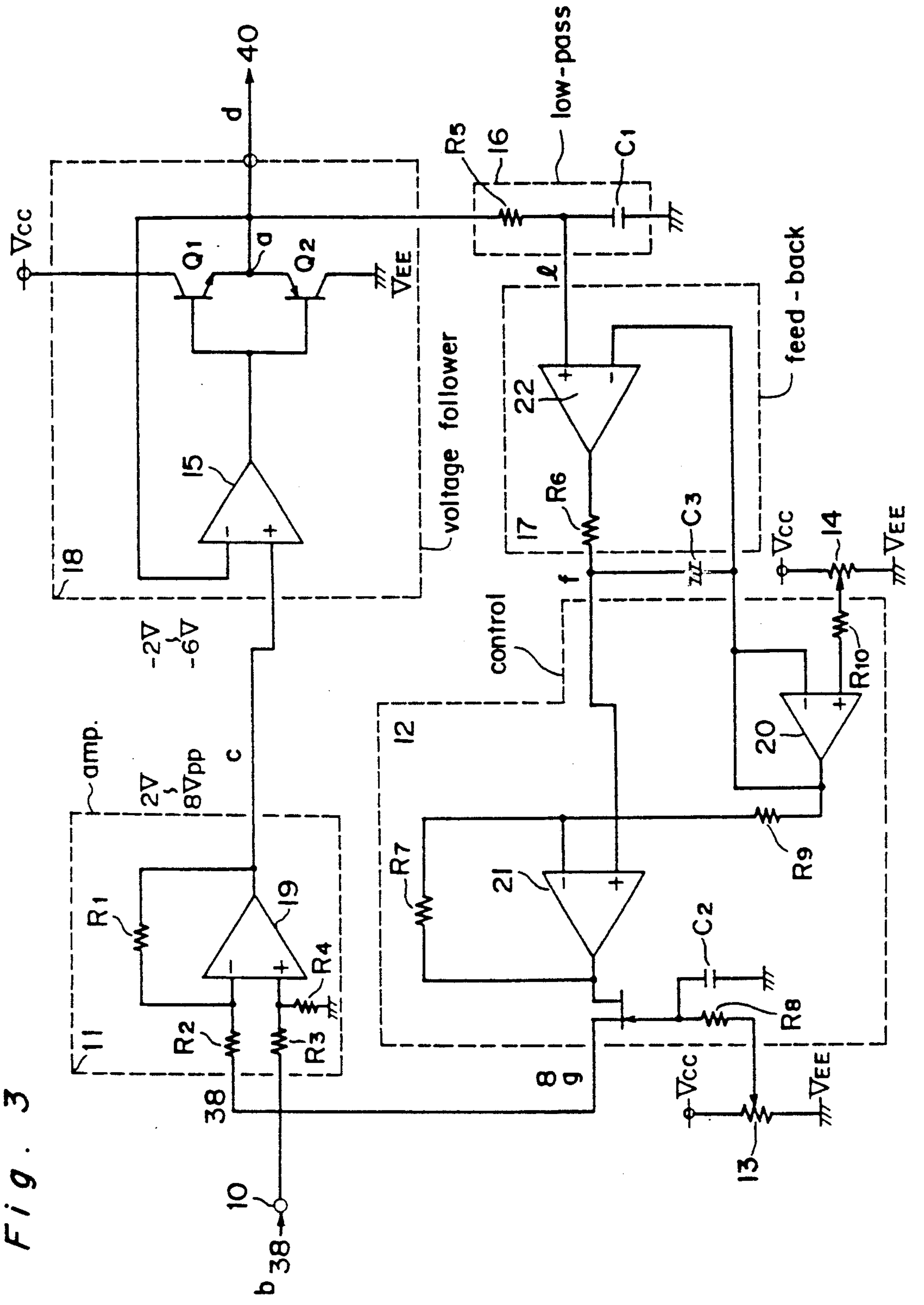
FIG. 3 is a circuit diagram showing a specific embodiment of a detailed circuit for the block diagram of FIG. 2.
Figure 4:
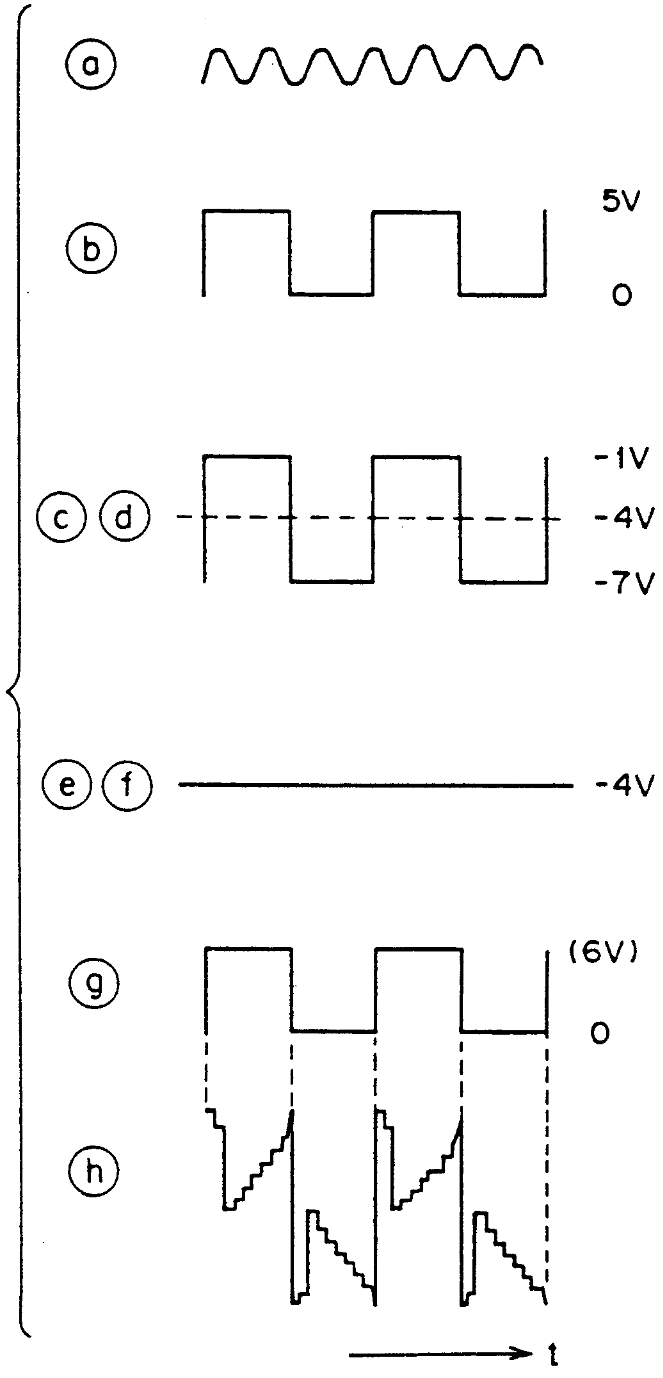
FIG. 4 is a wave form chart of the respective signals which occur at selected points in the diagrams of FIG. 1 and FIG. 3.

Embodiment:

FIG. 1 is a block diagram showing an overall construction of a liquid crystal display apparatus into which a common driver circuit has been built. FIG. 2 is a block diagram of a common driver circuit shown as one embodiment of the present invention. FIG. 3 is a circuit diagram showing a more specific embodiment of the respective blocks of FIG. 2. FIG. 4 is a signal wave form chart of the signals at selected points in FIG. 1 and FIG. 3.

In the liquid crystal display apparatus of FIG. 1, a LCD panel 40 which comprises a TFT array (Thin Film Transistor Array) is provided with a gate driver 40*a*, a source driver 40*b*, and a common driver 39. A gate driver driving signal is supplied to a gate driver 40*a* from a liquid crystal panel controller 38, a source driver driving signal is supplied to source driver 40*b*, a video driver 37, and a common signal is applied from common driver 39.

A video signal is inputted into a synchronous separation circuit 31 and a Y/C separation circuit 33. The synchronous signal which has been synchronously separated in the synchronous separation circuit 31 is supplied to liquid crystal panel controller 38 and to a clamp pulse generator 32 as a sine wave-form of 10 MHz or more as shown in FIG. 4 (*a*). In a Y/C separation circuit 33, the video signal is separated into a brilliance (luminance) signal Y and a cross (chrominance) signal C which are supplied to a video cross signal processing circuit 34. Prime color signals of R, G, B are supplied from the video cross signal processing circuit 34 to a brightness, contrast, gamma correcting circuit 35. A clamp pulse from clamp pulse generator 32 is supplied to the video cross signal processing circuit 34 and the brightness, contrast, gamma correcting circuit 35. The prime color signals R, G, B of the brightness, contrast, gamma correcting circuit 35 are processed in an inverter circuit 36 for supply to a source driver circuit 40*b* as the video signal output via a driver circuit 37, as shown in FIG. 4 (*h*). Liquid crystal panel controller 38 receives a synchronizing signal from a synchronous separation circuit 31, and also a clock pulse CK so as to output a gate driver drive signal and a source driver drive signal as control signals for the panel 40. At the same time, a frame pulse (FP) synchronized with the synchronous signal (an inversion pulse) is provided to common drive circuit 39 as a horizontal periodic signal of 0 through 5 V at 15 KHz. The inversion pulse is supplied from the liquid crystal panel controller 38 to an inverter 36 and to common driver 39. A horizontal periodic signal of 15 KHz, which has a DC level varying from 0 through 5 V is shown in FIG. 4 (*b*), is supplied as the FP signal to the common driver 39 for input to a buffer amplifier 11 as a common amplitude signal from a terminal 10 shown in FIG. 2. A control circuit 12 for controlling a bias amplitude is connected with the buffer amplifier 11. The control circuit 12 produces a set bias value established by a variable resistance 13 to the buffer amplifier 11, and also compares a bias set by a bias variable resistance 14 with a direct current level fed back from the output side of a common driver circuit so as to vary the bias set at amplifier 11 by a comparison output for supplying to the buffer amplifier 11. An operational amplifier 15 is connected with the buffer amplifier, the output from the above described buffer amplifier 11 being supplied to the (+) input terminal thereof as a pulse signal having a DC level of −1 V through −7 V with −4 V as shown in FIG. 4 (*c*) being provided as a center bias. The output of the operational amplifier 15 is connected to transistors Q1, Q2 for buffer use as shown so that the large capacitance load may be sufficiently driven, with a voltage feedback being effected from the output point (a) to the (−) input terminal of amplifier 15. The operational amplifier 15 and the buffer transistors Q1, Q2 comprise a voltage follower 18. The voltage follower output is connected to common electrode 40 of the liquid crystal panel, the output being fed as a pulse signal which has a DC level of −1 V through −7 V with −4 V being provided as a center bias as shown in FIG. 4 (*d*). It is also connected to a low-pass filter 16 comprising a resistor R5 and a capacitor C1. The output of the low-pass filter 16 is supplied to the above described control circuit 12 through a feedback circuit 17 as a signal of −4 V as shown in FIG. 4 (*e*). The feedback circuit 17 comprises an operational amplifier 22, with the output of the above described low-pass filter 16 being supplied to the plus (+) input terminal thereof. The output of the feedback circuit 17 is supplied as a −4 V signal, as shown in FIG. 4 (*f*), to one input terminal of first and second comparators 20, 21 of FIG. 3 constituting one portion of the control circuit 12. It is to be noted that the direct current voltage set by the variable bias resistance 14 is supplied to the other input terminal of one of the comparators. The output of comparator 20 controls the bias to be supplied to the buffer amplifier 11 so that the direct current voltage to be supplied through the feedback circuit 17 from the above described low-pass filter 16 is substantially the same as the direct current voltage supplied from the above described variable bias resistance 14 such bias being a pulse signal varied by the voltage at variable bias resistance 14 and 13 in both the DC level and the amplitude, respectively, as shown in FIG. 4 (*g*).

The block diagram of FIG. 2 is more specifically shown in the circuit diagram of FIG. 3. The buffer amplifier 11 comprises an operational amplifier 19 and resistors R1, R2, R3, R4. The voltage follower 18 comprises an operational amplifier 15 and a pair of transistors Q1, Q2 for buffer use. The feedback circuit 17 comprises an operational amplifier 22 and a resistor R6.

The low-pass filter circuit 16 comprises a resistor R5 and a capacitor C1, with the direct current component thereof being supplied to the operational amplifier of the feedback circuit 17. The feedback circuit 17 comprises an operational amplifier 22 and a resistor R6, with the output thereof being supplied to a first comparator 20 and a second comparator 21 of the control circuit 12. The control circuit 12 comprises a first comparator 20, a second comparator 21, resistors R7, R8, R9, R10 and a capacitor C2. The variable bias resistance 13 connected to the second comparator 21 is used to adjust the amplitude of the output signal from the control circuit 12. The variable bias resistance 14 connected to the first comparator 20 is used to adjust the center bias of the output signal from the control circuit 12.

The inversion or frame pulse inputted at the terminal 10 is amplified (or reduced) by the control signal from the control circuit 12 at the circuit 11, and at the same time, the bias is also controlled. The bias control signal provided by the control circuit 12 is obtained through the comparison by the feedback circuit 17 between a reference level set by the variable bias resistance 14 and the level of the signal supplied by the low-pass filter 16. The amplifier 19 of the circuit 11 is controlled so that the direct current component of the output of the voltage follower 18 becomes normally constant. The capacitor C3 together with the resistor R6 is provided for voltage smoothing purposes.

The inversion or frame pulse inputted into the common driver 39 is thereby adapted to be supplied to the liquid crystal panel LCD, with the amplitude stabilized by the specific circuit of FIG. 3 and the bias being set thereby.

Figure 5:
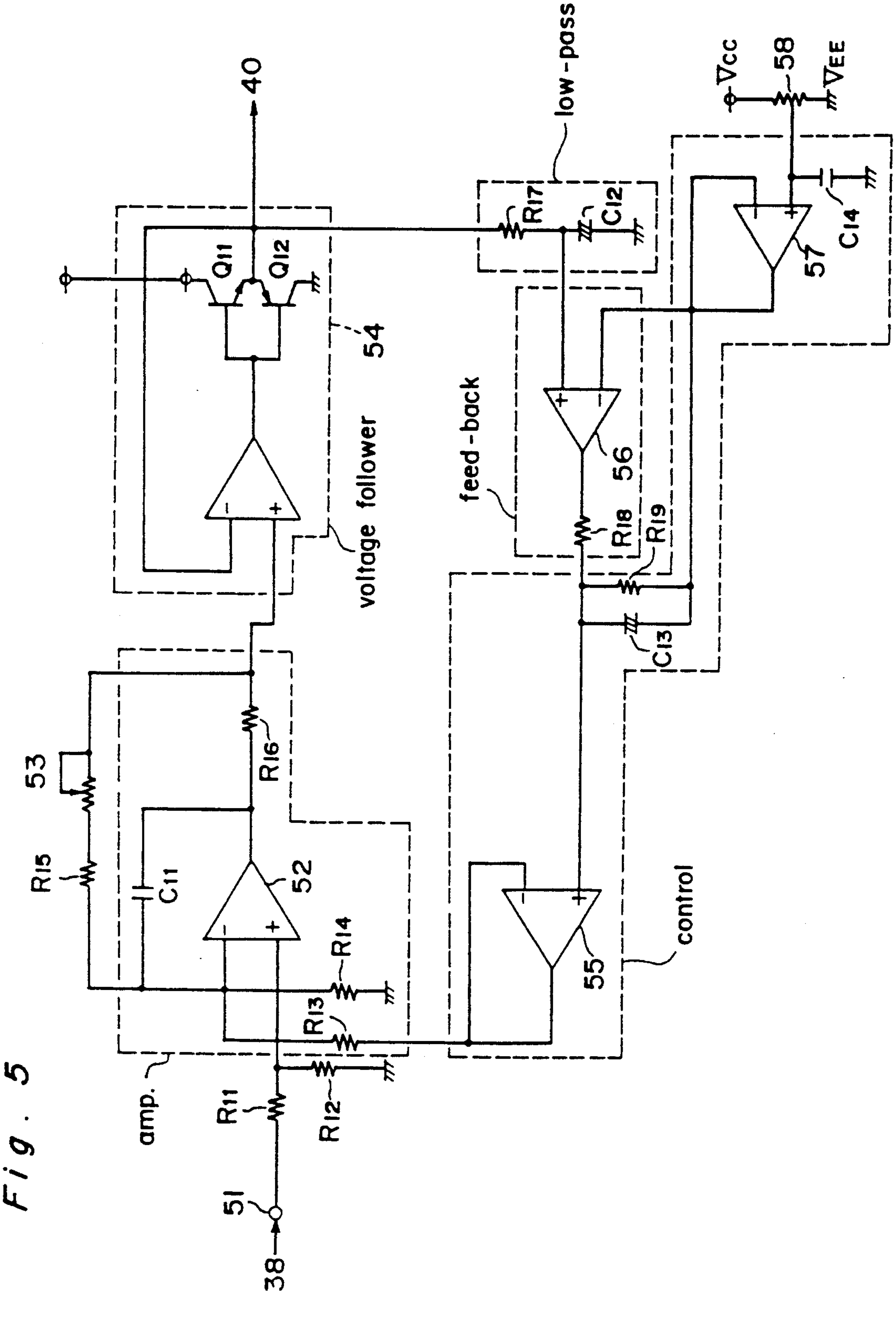
FIG. 5 is a circuit diagram showing a modified embodiment of the circuit diagram of FIG. 3.
Figure 6:
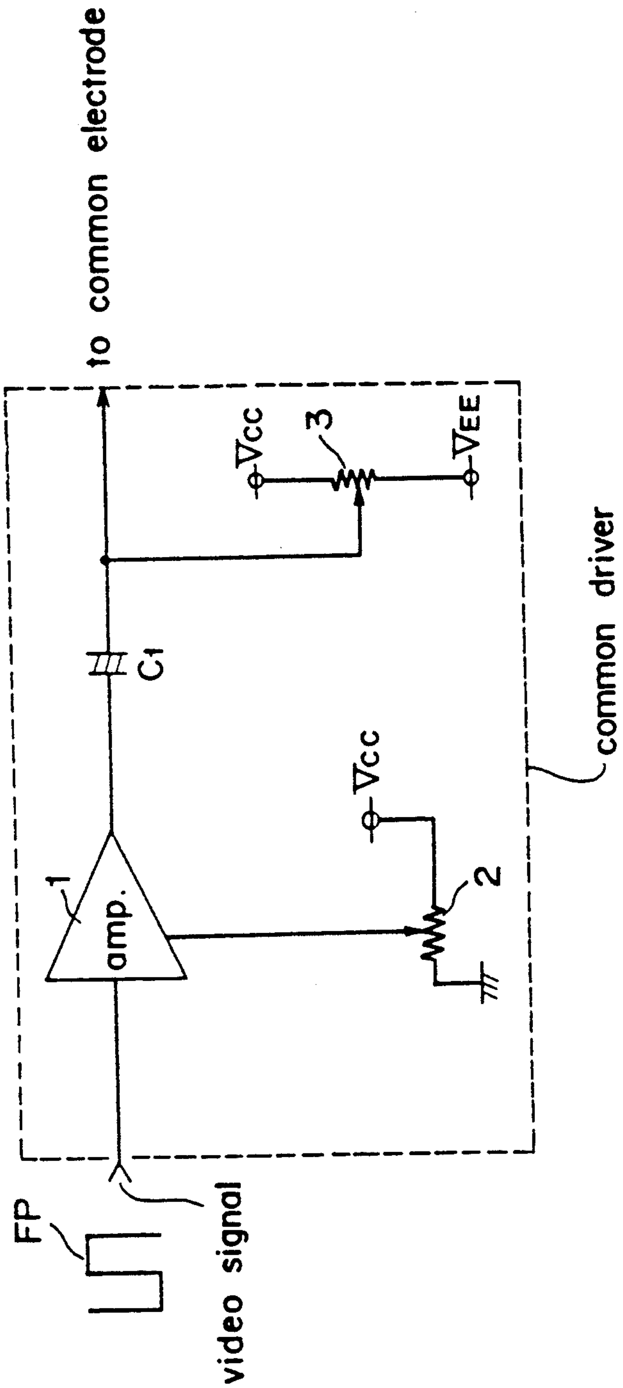
Fig. 6 PRIOR ART
FIG. 6 is a circuit diagram showing the conventional embodiment of this type of common driver circuit.

The common driver circuit in accordance with the present invention comprises a block diagram as shown in FIG. 2, and may be constructed as in the circuit diagram of FIG. 5 as a modification of the circuit in FIG. 3. In FIG. 5 the buffer amplifier comprises operational amplifier 52 and resistors R11, R12, R13, R14, R15, R16. In the circuit shown in FIG. 5, the inversion pulse is inputted at terminal 51 for supply to the operational amplifier 52. The amplitude of the inputted inversion pulse is adjusted by the variable resistor 53. The output of the amplifier 52 is supplied to a voltage follower 54, the output therefrom being supplied as the common output. Also, the common output is supplied to produce the direct current output from the low-pass filter comprising R17, C12, which is in turn supplied to the comparator 56. In comparator 56, the level set by comparator 57 and variable resistance 58 is compared with the above described low-pass filter output level, so that the comparator output is supplied to a voltage follower 55 through the low-pass filter comprising resistor R18, resistor R19 and capacitor C13. The output of follower 55 is supplied to amplifier 52 so that the output of the low-pass filter comprising resistor R17 and capacitor C12 may become normally a direct current component level set by the variable resistor 58. The capacitor C11 of FIG. 5 is provided for by-passing (especially when the higher frequency is handled) of high frequency components. The capacitor C13 smooths the output from comparator 56 and is tied to the reference voltage (at the output comparator 57). The capacitor C14 provides for the reduction of noise.

In FIG. 5, the common output is smoothed by the resistor R17 and capacitor C12, and is supplied to the comparator 56. Also, the bias set by resistor 58 is obtained using both Vcc, Vee from the power lines, i.e., from the source power voltage of the panel. The bias to be set by resistor 58 sets the bias of the common output and also becomes a reference voltage for the direct current feedback, so that the feedback circuit may follow variations in the source power voltage. When the source power voltage varies, the variations in the voltage to be applied to the panel become smaller because of the above follower operation. Since the circuits are all directly connected in the structure, a capacitor for removal of a direct current component is not required. The modified example of FIG. 5 provides the same effect as that of FIG. 3, and provides stability in that the feedback resistor 53 is varied to adjust the feedback amplitude in the buffer amplifier 52.

As is clear from the foregoing description, the common driver circuit in accordance with the present invention comprises a simple circuit construction which is provided with a voltage follower, a low-pass filter, a feedback circuit, and a control circuit. Variations in the direct current component which normally produce adverse effects in the processing of signals for this type of circuit are avoided so as to improve reliability. Also, in order to provide a common bias at the front stage of the output circuit, the direct current component is not required to be removed, so that a capacitor having a large capacity becomes unnecessary.

Although the present invention has been fully described by way of example with reference to the accompanying drawings, it is to be noted here that various changes and modifications will be apparent to those skilled in the art. Therefore, unless such changes and modifications depart from the scope of the present invention, they should be construed as included therein.

What is claimed is:

1. A common driver circuit for driving a load comprising a voltage follower circuit for supplying an output signal for driving said load;

buffer amplifier means for driving said voltage follower circuit;

adjustable bias setting means for providing an adjustable amplitude of a direct current bias level at said buffer amplifier means;

feedback means for controlling the direct current bias level at said buffer amplifier means, said feedback means including a low pass filter connected to the output signal of said voltage follower circuit for detecting a direct current bias level at said output signal;

means for providing a reference bias level; and bias setting control means responsive to the detected direct current bias level from said low pass filter and to the reference bias level for varying the adjustable direct current bias set at said buffer amplifier means so as to control the direct current bias level at said output signal.

2. The common driver circuit of claim 1 further comprising means, connected between said low pass filter and said control means, for voltage smoothing the direct current level detected by said low pass filter.

3. The common driver circuit of claim 1 and further comprising comparator means for comparing the direct current level detected by said low pass filter with the reference bias level and providing a comparison signal to said control means.

4. The common driver circuit of claim 1 further comprising a variable feedback resistance connected between an output and input of said buffer amplifier.

* * * * *